United States Patent
Patra et al.

(10) Patent No.: US 11,309,670 B2
(45) Date of Patent: Apr. 19, 2022

(54) SYSTEM AND METHOD FOR COMPACT ELECTRO-OPTICAL INTERFACE

(71) Applicant: Lawrence Livermore National Security, LLC, Livermore, CA (US)

(72) Inventors: Susant Patra, Brentwood, CA (US); Razi-Ul Muhammad Haque, San Francisco, CA (US); Komal Kampasi, San Francisco, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 262 days.

(21) Appl. No.: 16/591,821

(22) Filed: Oct. 3, 2019

(65) Prior Publication Data
US 2021/0104852 A1    Apr. 8, 2021

(51) Int. Cl.
| | |
|---|---|
| *H01S 5/183* | (2006.01) |
| *H01R 31/02* | (2006.01) |
| *H01S 5/02253* | (2021.01) |
| *H01S 5/02251* | (2021.01) |
| *H01S 5/02326* | (2021.01) |
| *H01R 27/02* | (2006.01) |
| *H01R 25/00* | (2006.01) |

(52) U.S. Cl.
CPC ......... *H01R 31/02* (2013.01); *H01S 5/02251* (2021.01); *H01S 5/02253* (2021.01); *H01S 5/02326* (2021.01); *H01S 5/18311* (2013.01); *H01S 5/18341* (2013.01); *H01R 25/003* (2013.01); *H01R 27/02* (2013.01)

(58) Field of Classification Search
CPC ............. H01S 5/02326; H01S 5/02253; H01S 5/02251
See application file for complete search history.

(56) References Cited

U.S. PATENT DOCUMENTS 5,283,851 A * 2/1994 Vergnolle ................. G02B 6/28
                                                                                       385/134
6,632,029 B1 * 10/2003 Williamson, III .. H01S 5/02251
                                                                                       385/92

FOREIGN PATENT DOCUMENTS

KR            0162752 B1 *     4/1999          H01S 5/02325

OTHER PUBLICATIONS

Machine Translation of KR0162752B1 (Year: 1999).*

* cited by examiner

*Primary Examiner* — Yuanda Zhang
(74) *Attorney, Agent, or Firm* — Harness, Dickey & Pierce, P.L.C.

(57) ABSTRACT

An electro-optical interface system is disclosed which incorporates a housing, an electrical circuit supported from the housing and configured to interface to a plurality of remote electrical components, an electronics subsystem and an optical subsystem. The electronics subsystem is housed within the housing and in communication with the electrical circuit. The optical subsystem is housed within the housing and in communication with the electronics subsystem. The optical subsystem receives electrical signals from the electronics subsystem which are representative of electrical signals received from the remote electrical components, and converts the received electrical signals into optical signals for transmission to a remote subsystem.

25 Claims, 5 Drawing Sheets

SYSTEM AND METHOD FOR COMPACT ELECTRO-OPTICAL INTERFACE

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to interface systems, and more particularly to an electro-optical interface system which forms a highly compact assembly for interfacing with large pluralities of electrical components and producing optical signals from received electrical signals, and which is especially well adapted for bioengineering applications where compact and robust components are needed with high packaging density.

BACKGROUND

The statements in this section merely provide background information related to the present disclosure and may not constitute prior art.

Bioengineering applications, and particularly those involving neural implants, can involve collecting neural responses from dozens, hundreds or even thousands or more individual electrodes, or applying electrical or optical signals to the human body, and particularly the brain, via a corresponding large number of electrodes.

As the need for recording electrical activity in bioengineering applications has increased in recent years, so too has the number of electrodes needed to accomplish the necessary recording. The issue becomes especially acute when tens of thousands of electrodes are needed to collect and transmit information to some subsystem for recording. Under this circumstance, the traditional approach of using individual electrical conductors to make contact with separate electrodes, and separate electrical conductors to route signals from each electrode to various electronics and signal conditioning components, becomes extremely unwieldly and impractical. This is because such existing systems are typically based on an all electrical processing interface which has to connect to the wires associated with each one of the electrodes. As the number of electrodes increases so does the corresponding number of independent wires that need to be incorporated and interfaced to other electronic components. The electrical interface which connects the large plurality of wires to associated electronics, such as amplifiers, signal conditioning and other electronic components, becomes a limiting factor when hundreds, thousands or more independent wires need to be interfaced to one or more other components. More specifically, the density of point-to-point wiring required, when interfacing signals from hundreds, thousands or more independent sensors, electrodes or similar electrical components to another subsystem, becomes limiting and costly factor when designing an interface system.

Accordingly, there is a strong need for a more capable, compact interface system that can receive electrical signals from large numbers of electrodes or other electrical components, and interface the signals to another subsystem.

SUMMARY

In one aspect the present disclosure relates to an electro-optical interface system. The interface system may comprise a housing and an electrical circuit supported from the housing. The electrical circuit is configured to interface to a plurality of remote electrical components. The interface system may also comprise an electronics subsystem housed within the housing and in communication with the electrical circuit, and an optical subsystem. The optical subsystem is housed within the housing and in communication with the electronics subsystem. The optical subsystem receives electrical signals from the electronics subsystem representative of electrical signals received from the remote electrical components, and converts the received electrical signals into optical signals for transmission to a remote subsystem.

In another aspect the present disclosure relates to an electro-optical interface system. The system may comprise a housing and an electrical circuit supported from the housing. The electrical circuit may include a plurality of electrical contact pads arranged in a planar grid, and configured to interface to a plurality of remote electrical components. The system may further include an electronics subsystem housed within the housing and in communication with the electrical circuit. An optical subsystem may be included a laser subsystem, housed within the housing and in communication with the electronics subsystem, for receiving electrical signals from the electronics subsystem representative of electrical signals received from the remote electrical components, and using the laser subsystem to convert the received electrical signals into optical signals. A graded index (GRIN) rod element at least partially housed in the housing and disposed adjacent the optical subsystem, for modifying a property of the optical signals transmitted by the laser before the optical signals are transmitted to a remote subsystem.

In still another aspect the present disclosure relates to a method for forming an electro-optical interface. The method comprises using an electrical circuit supported from a housing to collect electrical signals from a plurality of remote electrical components. The method further includes using an electrical subsystem supported from the housing, adjacent to the electrical circuit, to receive the electrical signals and to generate electrical drive signals. The method further include using the electrical drive signals to drive an optical subsystem housed adjacent the electrical subsystem within the housing, in which the optical subsystem generates optical signals in response to the electrical drive signals. The method further includes communicating the optical signals to a remote subsystem.

This section provides a general summary of the disclosure, and is not a comprehensive disclosure of its full scope or all of its features.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which.

DETAILED DESCRIPTION

Example embodiments will now be described more fully with reference to the accompanying drawings.

Figures 1, 2, 3:
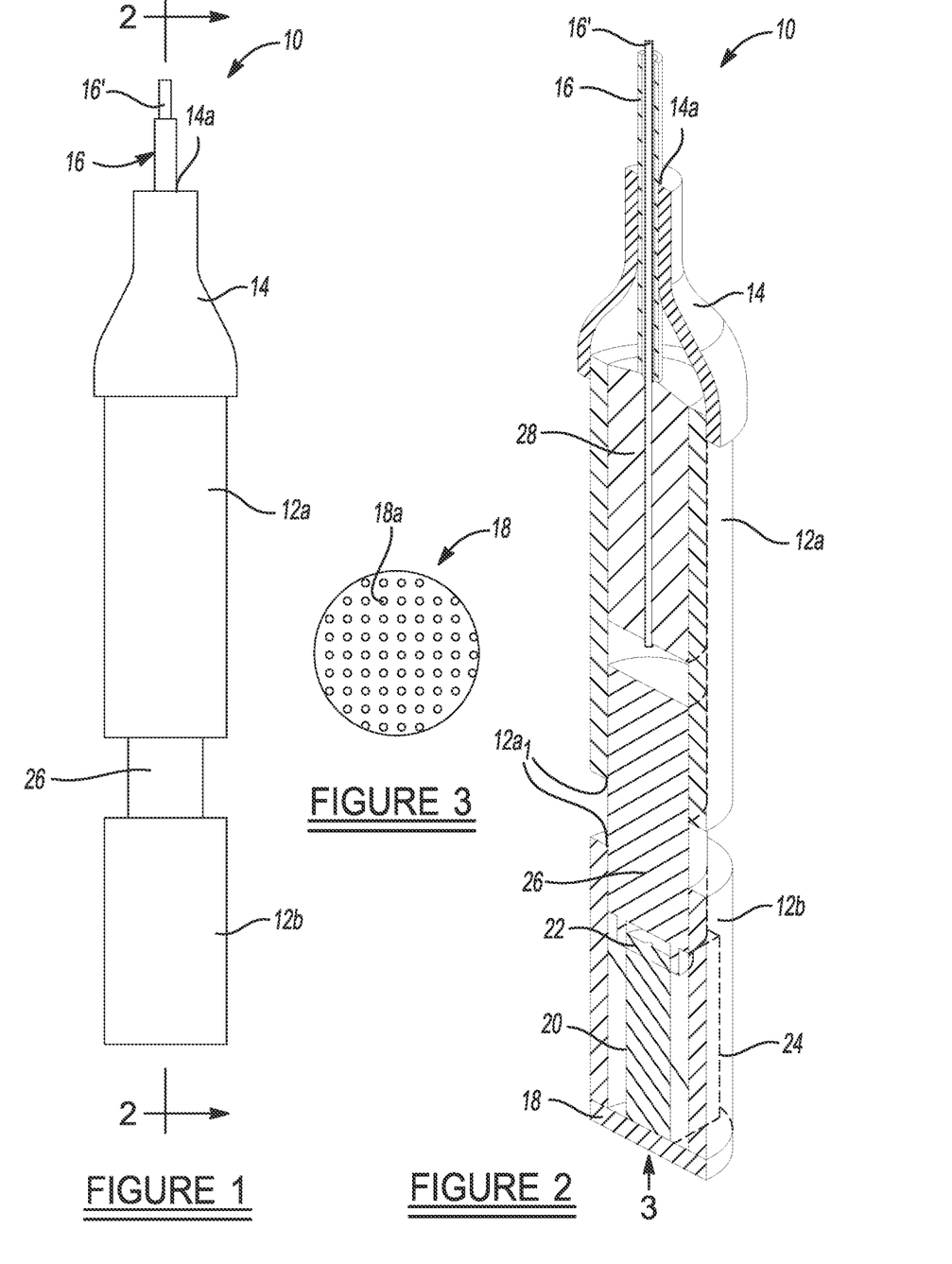
FIG. 1 is a high level block diagram of one embodiment of an electro-optical interface system 10 in accordance the present disclosure.
FIG. 2 is a cross-sectional perspective view of the electro-optical interface system of FIG. 1 taken in accordance with section line 2-2 in FIG. 1.
FIG. 3 is an end view of the interface system of FIG. 2 taken in accordance with directional line 3 in FIG. 2.

Referring to FIG. 1 there is shown an electro-optical interface system 10 in accordance with one embodiment of the present disclosure. The electro-optical interface system 10 (hereinafter simply "interface system 10") in this example includes a housing 12 formed by upper and lower housing sections 12a and 12b, which preferably form hermetically sealed structures. The housing sections 12a and 12b may be made from any suitable materials, for example glass, metal silicone, etc. An upper end of the interface system 10 includes a cover or cap 14, which may be made from glass, metal, silicone or other suitable materials, and which has an opening 14a through which an optical fiber 16 extends. The cap 14 also operates as a strain relief element and may be secured to the upper housing section 12a via adhesives or any other suitable connection scheme. The optical fiber 16 has an optical fiber ferrule 16' and may be coupled to an external/remote optical subsystem which communicates with the interface system 10.

FIG. 2 shows a high level, simplified, perspective cross-sectional view of the interface system 10 of FIG. 1 illustrating its various internal components. The interface system 10 may incorporate an electrical interface circuit 18, an electronic driver/amplifier subsystem 20 in communication with the electrical interface circuit 18, and an optical subsystem 22 in communication with the driver/amplifier subsystem 20. In one embodiment the optical subsystem 22 may comprise a laser subsystem, for example a laser diode. In another embodiment the optical subsystem 22 may form a vertical cavity surface emitting laser (VCSEL). Both embodiments are contemplated by the present disclosure, although for the following discussion, a laser diode will be referenced as the optical subsystem 22. The laser diode 22, the driver/amplifier subsystem 20 and the electrical interface circuit 18 may be enclosed together in a separate hermetic jacket 24, which may be comprised of silicone.

The laser diode 22 is disposed adjacent a graded index ("GRIN") rod element 26. The GRIN rod element 26 in this example is partially housed in the lower housing 12b and partially housed in the upper housing 12a as well, and hermetically sealed at circumferential areas 12a1 and 12a2 in FIG. 2 to help create a fully hermetically sealed interface housing 12 structure. An opposing end of the GRIN rod element 26 is disposed closely adjacent a ferrule sleeve 28 having a portion of the optical fiber ferrule 16' enclosed therein. The optical fiber ferrule 16' extends through the ferrule sleeve 28 and through the cap element 14.

While the housing 12 has been shown as two sections 12a and 12b in FIGS. 1 and 2, it will be appreciated that a single piece housing could be just as easily implemented, although the hermetic sealing would need to be accomplished at the upper and lower ends of the housing. Also, while FIGS. 1 and 2 show the interface system 10 with an integrated length of optical fiber 16 forming an integral portion of the overall system 10, the system 10 could easily be modified such that it is attachable to an external length of fiber optic cable via a suitable connector (e.g., a conventional FC/PC connector commercially available from a number of sources, for example Thorlabs Inc. of Newton, N.J.). If configured to be attached to a separate length of fiber optic cable, the system 10 could still incorporate a short length of a fiber optic cable element inside the housing 12 which is coupled to the GRIN rod element 26 via a separate connector. An advantage of this construction is that the GRIN rod element 26 and the short length of fiber optic cable element can be pre-aligned within the housing 12 of the interface system 10. Alternatively, the interface system 10 may even be configured such that the GRIN rod element 26 is directly coupled to the external fiber optic cable via a suitable connector (i.e., no internally housed section of fiber optic cable element being used in this configuration). While this latter configuration may be slightly more complex, from a standpoint of making sure no misalignment is present between the GRIN rod element 26 and the external fiber optic cable, in some applications this configuration may still be desirable.

Referring to FIG. 3, the electrical interface circuit 18 of the system, in this example, forms a generally flat surface structure having a plurality of electrical interface pads 18a, which form electrical connection points for interfacing with separate electrical conductors of an electrical connector assembly. While only a few such electrical interface pads 18a are illustrated, to avoid cluttering the figure, an implantation of the electrical interface circuit 18 may include dozens, hundreds, thousands or more such interface pads, depending on the specific application that the interface system 10 is being used with. The electrical interface pads 18a may be arranged in virtually any pattern (e.g., X-Y grid, concentric circles, concentric squares, etc.) as needed to tailor it for a specific implementation.

One highly important feature of the interface system 10 is that it forms a highly compact, lightweight component that enables a large plurality of electrical signals to be collected and converted to corresponding optical signals, and then transmitted over a single fiber optic cable to an external/remote subsystem for collection. This eliminates the limitations presented when dozens, hundreds, thousands or more extremely small, delicate electrical wires are used to interface electrodes implanted in the human body to external/remote electronic collection and recording devices. The ability to collect signals from a large plurality of microelectrodes, and transmit the signals as optical signals over a single optical fiber significantly reduces the practical limitations in interfacing to large pluralities of the microelectrodes. In effect, the interface system 10 removes the "bottleneck" that occurs when attempting to electrically interface to a large plurality of sensors or microelectrodes.

The interface system 10 is suitable in size, weight and dimensions to be easily implanted under the skin of an individual. The dimensions of the interface system 10 may vary as needed to accommodate the numbers of microelectrodes or sensors which the interface system 10 is being interfaced to. However, in one implementation, the dimensions of the interface system 10 may be on the order of about 5-10 mm in length by 0.25-0.5 mm in diameter.

While the interface system 10 is shown as a having an overall cylindrical shape, other shapes, such as elongated rectangular, square, etc. are just as feasible. It is anticipated, however, that the elongated cylindrical configuration shown in FIGS. 1 and 2 will be especially popular in bioengineering applications where the interface system 10 is implanted under the skin of a person and used to interface with one or more implanted microelectrode arrays.

It will also be appreciated that the interface system 10 can be constructed to function in the opposite sense to receive optical control signals, convert the optical control signals to corresponding electrical signals, and then apply the corresponding electrical signals to external microelectrodes or other electrical components. Suitable changes to the driver/amplifier subsystem 20 will be required, which would be well within the level of expertise of those skilled in this art, to provide an electronic circuit which is able to convert the optical signals to corresponding electrical signals, and the laser diode 22 can be replaced with a photodiode in this implementation. A "hybrid" interface system, which includes the needed electronics to accomplish both outputting optical signals from received electrical signals, and inputting optical signals which are converted to corresponding electrical signals to be applied to independent microelectrodes, is also contemplated by the present disclosure.

In operation, the interface system 10 uses the driver/amplifier subsystem 20 to receive the electrical signals from the electrical interface pads 18a to drive the laser diode 22. The laser diode 22 generates optical pulses in accordance with received electrical signals which vary in some respect, for example in pulse length, phase or magnitude. The optical signals are transmitted over the optical fiber 16 to the remote subsystem. The GRIN rod element 26 in this example is used to collimate and focus the incoming divergent laser beam and efficiently couple it into the fiber 16'.

Figures 4, 5, 6:
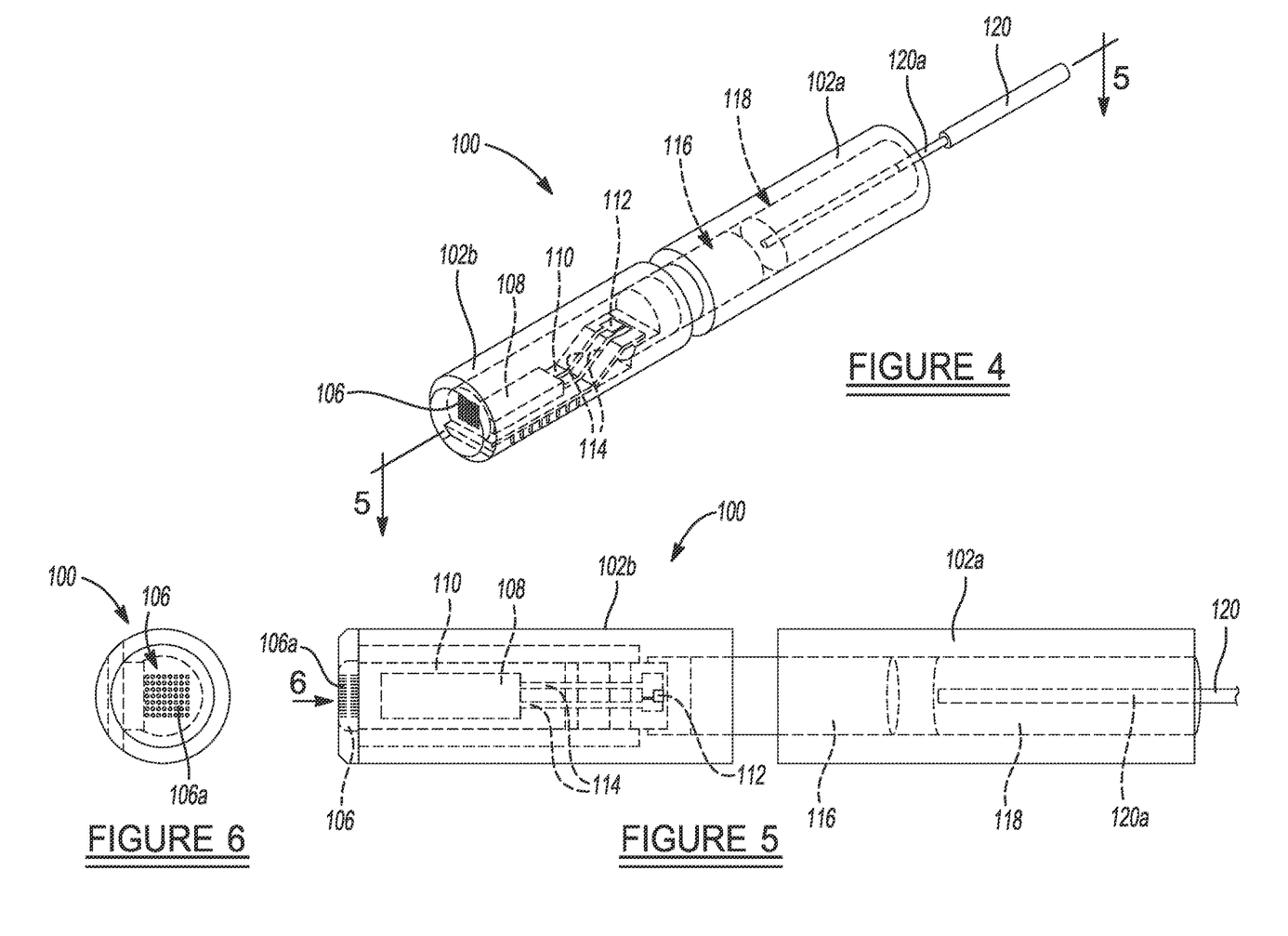
FIG. 4 is a perspective view of an interface system in another embodiment of the present disclosure.
FIG. 5 is a simplified side cross-sectional view of the interface system of FIG. 4 taken in accordance with section line 5-5 in FIG. 4.
FIG. 6 is an end view of the interface system of FIG. 5 taken in accordance with directional line 6 in FIG. 5.

FIGS. 4 and 5 show another embodiment of an interface system 100 in accordance with the present disclosure. In this embodiment the interface system similarly includes upper and lower hermetically sealed housing sections 102a and 102b, with an optical fiber cable 120 extending from the upper housing section 102a. For clarity, the cap (strain relief component) 14 shown in FIG. 1 has not been shown in FIG. 4, although such a strain relief component is preferably included with the interface system 100.

The lower housing section 102b houses an electrical interface circuit 106 which is in electrical communication with an electronics subsystem 108. In this example the electronics subsystem 108 comprises an application specific integrated circuit (ASIC) that includes one or more of drivers, preamplifiers, memory, multiplexers, and optionally a controller. The electronics subsystem 108 is supported on a circuit board 110 along with an optical subsystem 112. In this embodiment the optical subsystem 112 comprises a laser subsystem, and in one specific embodiment a laser diode, although other forms of lasers subsystems (e.g., VCSEL subsystem) may potentially be incorporated in place of the laser diode. The precise form of optical subsystem 112 selected may depend in on various factors including the specific implementation in which the interface system 10 is being used. The optical subsystem 112 is coupled via circuit traces 114 to the electronics subsystem 108. The optical subsystem 112 generates optical signals in the form of optical pulses which vary in some controlled respect (e.g., pulse length, phase, magnitude, etc.) in relation to the electrical signals output from the electronics subsystem 108.

Referring further to FIGS. 4 and 5, the interface system 100 further includes a GRIN rod element 116 which is partially housed in each of the upper and lower housing sections 102a and 102b, respectively. The GRIN rod element 116 is longitudinally aligned with a ferrule sleeve 118 which houses the optical fiber element 120. The optical subsystem 112, which in this embodiment is shown as a laser diode, is axially aligned with an axial center of the optical fiber element 120.

In operation, optical signals from the optical subsystem 112 are emitted and pass through the GRIN rod element 116 into a portion of the optical fiber 120 encased in the ferrule sleeve 118. The optical signals are then transmitted out over the optical fiber element 120 to a remote/external subsystem for collection, recording and/or analysis.

FIG. 6 shows the electrical interface circuit 106. The electrical interface circuit 106 includes electrical contact pads 106a arranged in an X/Y grid in this example, although other arrangements (e.g., concentric circular rings) are just as easily implemented. The electrical contact pads 106a are exposed so that a separate electrical connector can be secured to the electrical interface circuit 106.

Figure 7:
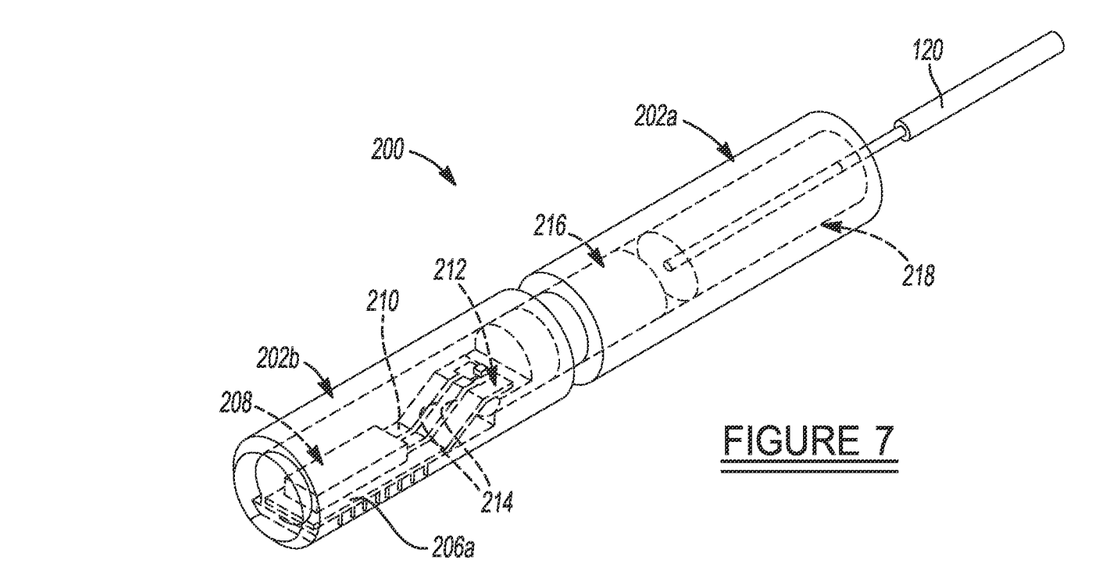
FIG. 7 is a perspective view of another embodiment of an electro-optical interface system of the present disclosure.
Figures 8, 9:
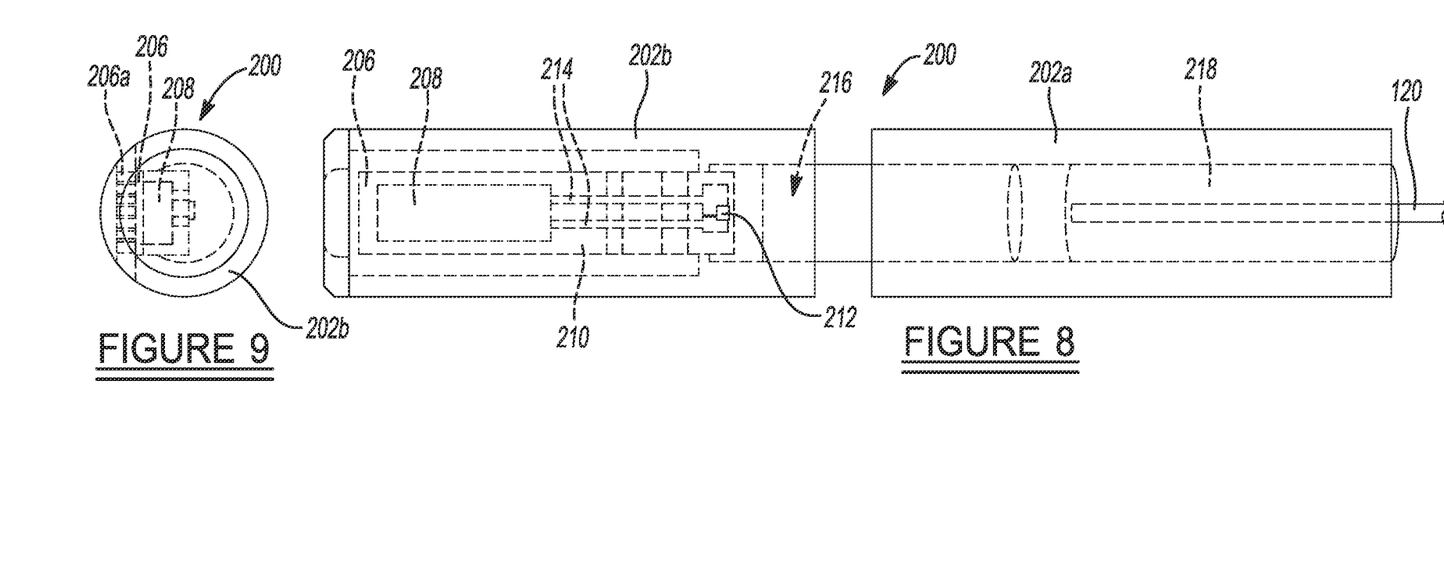
FIG. 8 is a simplified side cross-sectional view of the interface system of FIG. 7 taken in accordance with section line 8-8 in FIG. 7.
FIG. 9 is an end view of the interface system of FIG. 8 taken in accordance with directional line 9 in FIG. 8.

Referring to FIGS. 7-9, an electro-optical interface system 200 is shown in accordance with another embodiment of the present disclosure. The interface system 200 is similar in construction to the interface system 100, and accordingly similar components have been designated with reference numbers increased by 100 over those used in connection with FIGS. 4-6. The interface system 200 differs in that the electrical interface circuit 206 includes electrical contact pads 206a which project radially outwardly towards a side portion of the lower housing section 202b, rather than along the longitudinal axis of the lower housing section 102b toward one end of the lower housing section. The construction is otherwise identical to the interface system 100. The configuration of the electrical interface circuit 206 thus enables a connection with an external connector within a slightly shorter longitudinal space than what would be required with the interface system 200, but nevertheless requires a small amount of additional space to be available along the side of the lower housing section 202b.

Figure 10:
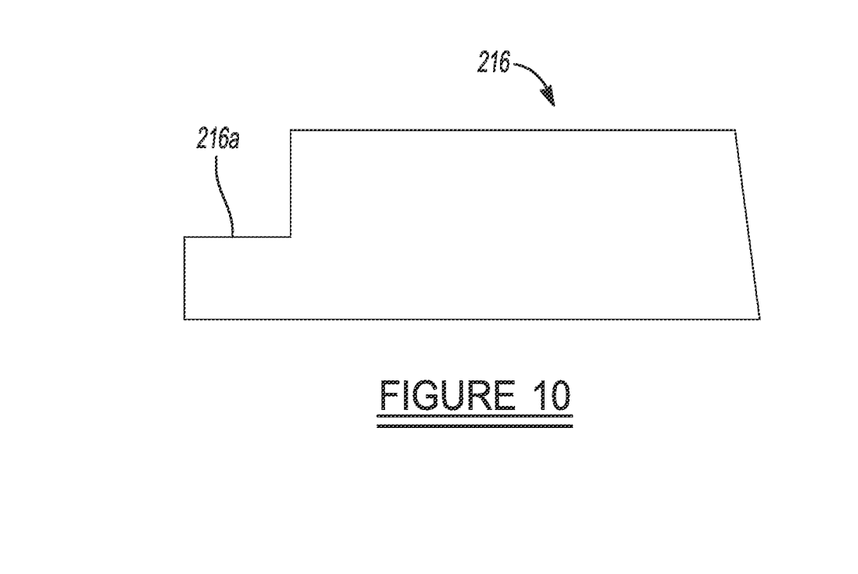
FIG. 10 is an enlarged side view of the GRIN rod element shown in FIG. 7.
Figure 11:
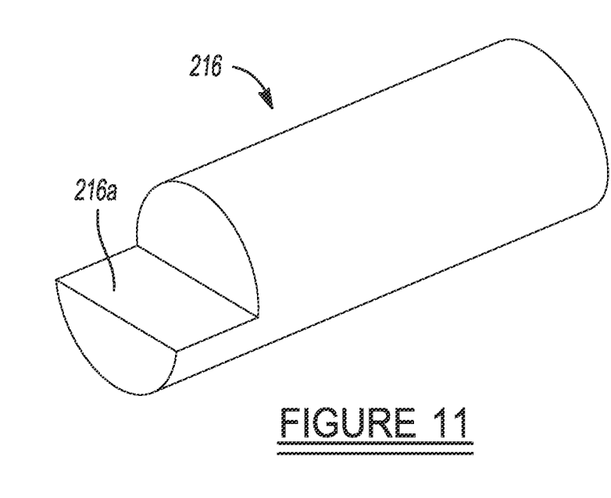
FIG. 11 is a perspective view of the GRIN rod element of FIG. 10.
Figure 12:
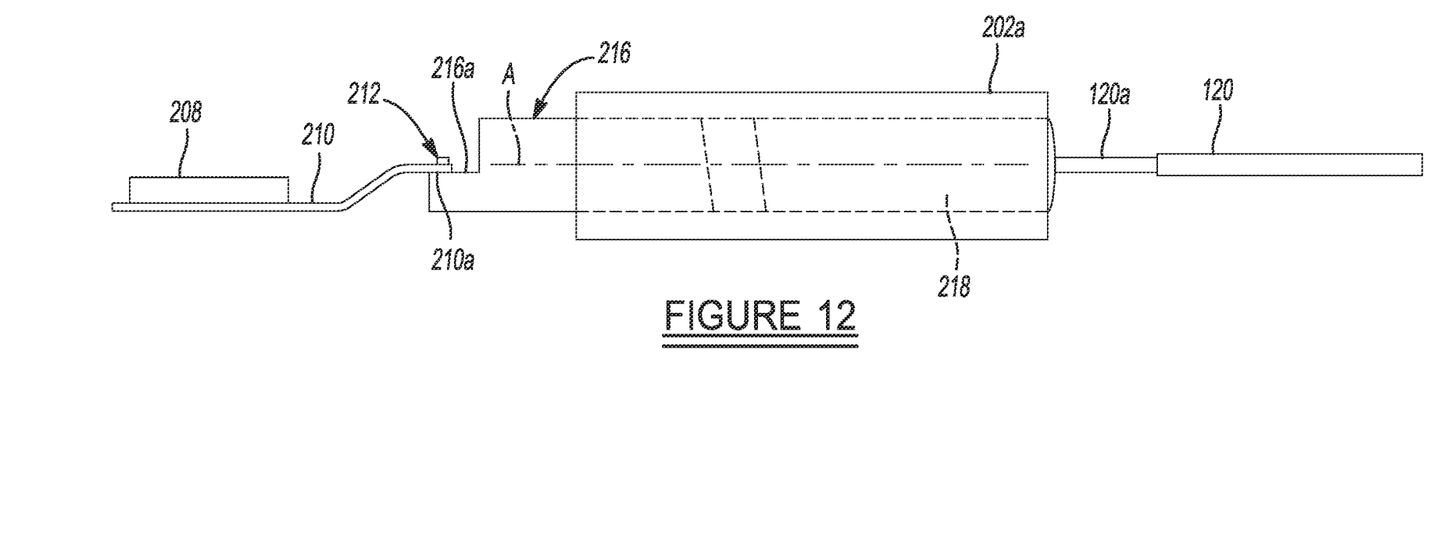
FIG. 12 is a simplified side view of one specific attachment configuration for securing the circuit board that supports the laser diode in axial alignment with the fiber optic cable.

Referring now to FIGS. 10-12, additional details of different construction arrangements for the attachment of the laser diode 212 to the GRIN rod element 216 can be seen. It will be appreciated that the GRIN rod element 116 and the laser diode 112 may be secured in an identical fashion to that shown in FIGS. 10-12. The GRIN rod element 216 shown in FIGS. 10-12 includes a planar notch portion 216a. The planar notch portion 216a enables a distal portion 210a of the circuit board 210 supporting the laser diode 212 to be supported thereon and secured thereto to the planar notch portion such that the laser diode 212 is axially aligned with an axial center of the optical fiber element 120a of the optic fiber element 120, as indicated line "A" in FIG. 10. In this example the alignment is at the axial center of the GRIN rod element 216.

Figure 13:
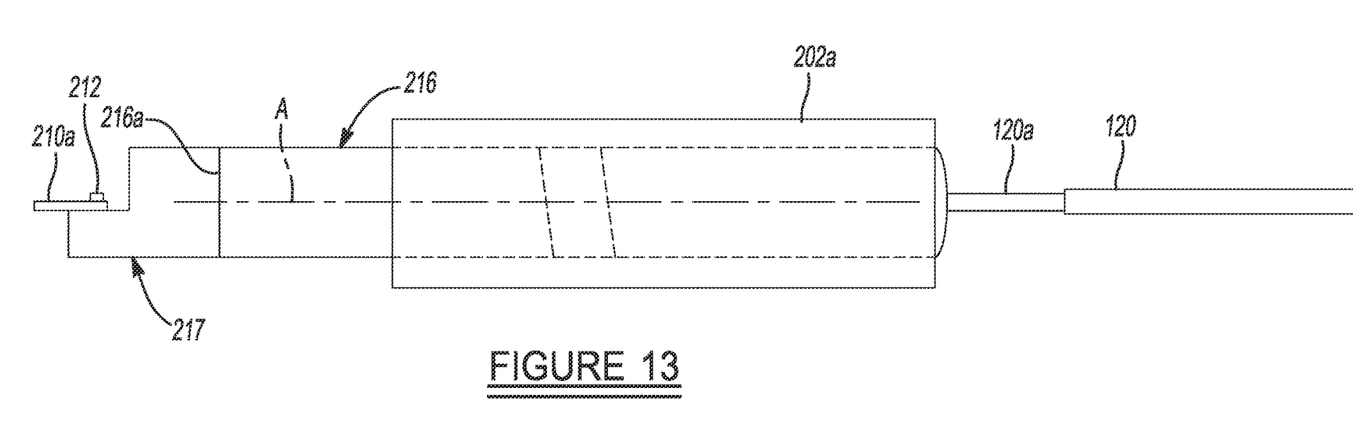
FIG. 13 is a side view of another attachment configuration where a diode support glass element is used to interface the circuit board which supports the laser diode to the GRIN rod element, and which may provide reduced loss of the optical signal being transmitted into the optical fiber.

FIG. 13 illustrates the GRIN rod element 216 incorporating a diode support glass element 217 constructed from an optically transmissive material, for example borosilicate glass. The diode support glass element 217 is one example of a structure that forms a hermetic glass package for the laser diode 212. The diode glass support element 217 also forms an interface with the planar surface 216b and includes a notch surface 217a to which the distal portion 210a of the circuit board 210 is attached. The attachment may be via suitable adhesives or by any other means. The diode support glass element 217 helps to reduce loss in the optical signal due to any surface quality limitations present on the exposed surface of the GRIN rod element 216. The laser diode 212 is similarly aligned with the axial center of the optical fiber 120 as indicated by dashed line "A".

Figure 14:
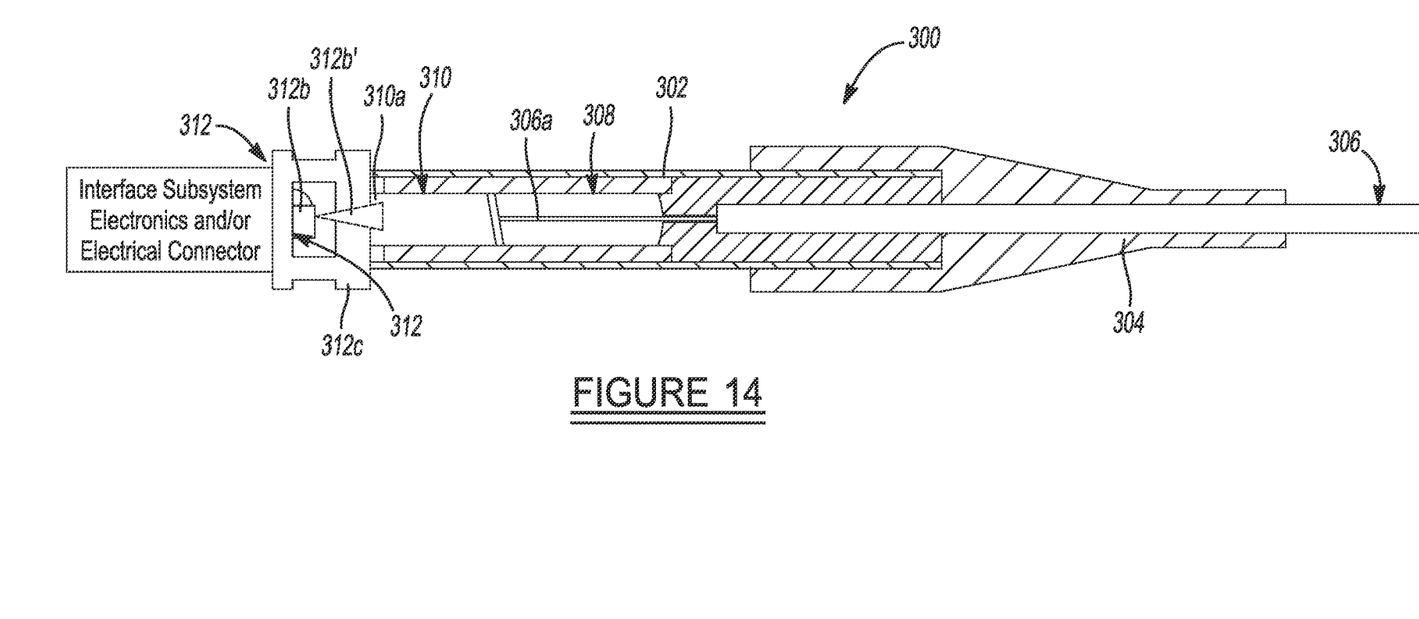
FIG. 14 is a simplified side view of another embodiment of the interface system incorporating a VCSEL subsystem as the optical subsystem.

Referring to FIG. 14, a simplified side view of an electro-optical interface system 300 (hereinafter simply "interface system" 300) is shown in accordance with another embodiment of the present disclosure. The interface system 300 in this example includes a single piece housing 302 having a strain relief cap 304 secured thereto through which a portion of a fiber optic cable 306 passes. The housing 302 houses a pigtailed ferrule 308 which receives an optical fiber 306a of the fiber optic cable 306. The housing 302 also houses a GRIN rod element 310. The interface system 300 differs from the interface systems 10, 100 and 200 in that it incorporates a Vertical Cavity Surface Emitting Laser ("VCSEL") subsystem 312 in place of the laser diode 112 and 212 of the prior embodiments. The VCSEL subsystem 312 includes a hermetically sealed housing 312a which encloses and supports a laser 312b, and incorporates a flat glass lens portion 312c through which a beam 312b' from the VCSEL subsystem 312b projects into the GRIN rod element 310. Preferably, the VCSEL laser subsystem 312b is mounted so that it is axially aligned with an axial center of the fiber optic cable 306.

It will be appreciated that the GRIN rod elements 310, 216, 116 or 26 discussed herein do not require a focusing lens (i.e., a focusing lens disposed in front of it relative to the path of the optical beam). However, it will also be appreciated that the flat glass lens 312c could be constructed as a collimation/focusing lens if needed to meet the needs of a specific application or implementation.

The VCSEL subsystem 312 is typically supported with the flat glass lens 312c closely adjacent to, or in contact with, an exposed surface 310a of the GRIN rod element 310. In one implementation the VCSEL subsystem 312b is positioned within about 525 μm of the exposed surface 310a of the GRIN rod element 310. A diameter of the flat glass lens portion 312c may vary depending on a diameter of the GRIN rod element 310, but in one implementation is about 1 mm or less in diameter. In one specific implementation the VCSEL subsystem 312b may produce a beam 312b' having a wavelength of 850 nm, and may operate as a single mode or multimode laser device to meet the needs of a specific application. The specific wavelength chosen, again, may vary to meet the needs of a specific application. Antireflective coatings may also be used on the flat glass lens 312c and/or the surface 310a of the GRIN rod element 310. The pitch of the GRIN lens may be varied between about 0.25-1 to accommodate different object and image distances to match specific design needs.

The various embodiments of the interface systems 10, 100, 200 and 300 described herein, while being especially well adapted for use in bioengineering applications, and especially in neural monitoring applications, are expected to find utility in other areas and applications as well. The various embodiments of the present disclosure are expected to find utility in any application where it is necessary to collect a plurality of electrical signals and interface the collected signals efficiently to an external/remote subsystem, and especially in applications where electrical signals from dozens, hundreds, thousands or more sensors or microelectrodes need to be collected and interfaced, in a highly compact assembly, to some external device or subsystem. The various embodiments of the present disclosure eliminate the limitations of using dozens, hundreds, thousands or more small electrical wires when collecting data from a large plurality of microelectrodes or sensors, and enable a large plurality of signals to be efficiently collected and transmitted, using an extremely small subsystem which is ideally suited for implanting in human tissue, as optical signals to a remote device/subsystem. The highly space efficient packaging of the various embodiments enable the various embodiments to be easily carried on the person of an individual or even implanted within tissue of an individual.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An electro-optical interface system comprising:
    a housing having a first opening at a first end to receive a portion of an optical fiber, and a second opening at a second end of the housing;
    an electrical circuit supported from the housing and configured to interface to a plurality of remote electrical components;
    an electronics subsystem at least one of housed within the housing or positioned adjacent to the housing, and in communication with the electrical circuit;
    an optical subsystem positioned at least one of adjacent to the housing or housed within the housing and in communication with the electronics subsystem for receiving electrical signals from the electronics subsystem representative of electrical signals received from the remote electrical components, and converting the received electrical signals into optical signals for transmission to a remote subsystem; and
    a graded index (GRIN) rod element independent of the optical fiber and having a dimension enabling an interface thereof to the second opening of the housing, the GRIN rod element configured to collimate and focus the optical signals prior to transmission to the remote subsystem.

2. The system of claim 1, further comprising a length of optical fiber at least partially housed in the housing and in communication with the optical subsystem for transmitting the optical signals to the remote subsystem.

3. The system of claim 2, further comprising a ferrule sleeve housed within the housing for encasing a portion of the optical fiber.

4. The system of claim 1, wherein the housing comprises first and second housing portions, and wherein the GRIN rod element is partially housed in both of the first and second housing sections.

5. The system of claim 4, further comprising a diode support glass element disposed against one end of the GRIN rod element, for supporting the optical subsystem thereon.

6. The system of claim 1, wherein the optical subsystem comprises a laser subsystem.

7. The system of claim 6, wherein the laser subsystem comprises a laser diode.

8. The system of claim 7, wherein the laser diode is supported within the housing to transmit the optical signals longitudinally toward one longitudinal end of the housing.

9. The system of claim 8, further comprising a length of optical fiber in communication with the laser diode, and wherein the laser diode is supported to be axially aligned with an axial center of the length of optical fiber.

10. The system of claim 6, wherein the laser subsystem comprises a vertical cavity surface emitting laser (VCSEL) subsystem.

11. The system of claim 10, further comprising a length of optical fiber in communication with the VCSEL and configured to receive the optical signals from the VCSEL, and wherein the VCSEL subsystem is supported within the housing so as to be axially aligned with an axial center of the length of optical fiber.

12. The system of claim 1, further comprising a cap covering the first end of the housing.

13. The system of claim 12, further comprising:
    a fiber optic element in communication with the optical subsystem and configured to receive the optical signals from the optical subsystem,
    the cap including an opening aligned with an axial center of the housing and with the first opening; and
    the fiber optic element extending through the opening in the cap, and the cap configured to provide a strain relief function relative to the fiber optic element.

14. The system of claim 1, wherein the electrical circuit includes a plurality of electrical contact pads for making electrical connections with the remote electrical components.

15. The system of claim 14, wherein the electrical contact pads are configured to project outwardly toward one longitudinal end of the housing, parallel to a longitudinal length of the housing.

16. The system of claim 14, wherein the electrical contact pads are configured to project out from a side of the housing non-parallel to the longitudinal length of the housing.

17. An electro-optical interface system comprising:
    a housing having a first opening at a first end, and a second opening at a second end thereof which is coaxial with the first opening;
    an optical fiber extending partially into the housing;
    an electrical circuit supported from the housing and including a plurality of electrical contact pads arranged in a planar grid, and configured to interface to a plurality of remote electrical components;
    an electronics subsystem housed within the housing and in communication with the electrical circuit;

an optical subsystem including a laser subsystem, housed within the housing and in communication with the electronics subsystem, for receiving electrical signals from the electronics subsystem representative of electrical signals received from the remote electrical components, and using the laser subsystem to convert the received electrical signals into optical signals;

a graded index (GRIN) rod element independent of the optical fiber and partially housed in the second end of the housing, and having a portion with a first terminal end communicating with the optical fiber and a second terminal end projecting outwardly from the housing, and further being disposed with the second terminal end adjacent the optical subsystem, for modifying a property of the optical signals transmitted by the laser and transmitting the optical signals into the GRIN rod element, and subsequently from the optical fiber to a remote subsystem.

18. The system of claim 17, further comprising a length of optical fiber at least partially housed in the first opening of the housing for receiving the optical signals passing through the GRIN rod element and transmitting the optical signals to the remote subsystem.

19. The system of claim 17, wherein the laser subsystem comprises a diode laser.

20. The system of claim 17, wherein the laser subsystem comprises a vertical cavity surface emitting laser (VCSEL) subsystem.

21. The system of claim 17, wherein the electrical contact pads are arranged to project toward one longitudinal end of the housing and generally parallel to a longitudinal axis of the housing.

22. The system of claim 17, wherein the electrical contact pads are arranged to project outwardly from a side of the housing non-parallel to a longitudinal axis of the housing.

23. A method for forming an electro-optical interface, the method comprising:

using an electrical circuit supported from a housing to collect electrical signals from a plurality of remote electrical components;

using an electrical subsystem supported from the housing, adjacent to the electrical circuit, to receive the electrical signals and to generate electrical drive signals;

using the electrical drive signals to drive an optical subsystem housed adjacent the electrical subsystem within the housing, in which the optical subsystem generates optical signals in response to the electrical drive signals;

using a graded index (GRIN) rod element having a first end communicating with an opening in the housing, and a second end projecting to a point adjacent the optical subsystem, to receive the optical signals and to collimate the optical signals before the optical signals are transmitted to an optical fiber;

wherein the GRIN rod element is independent of the optical fiber and positioned to communicate with the optical fiber; and communicating the optical signals to a remote subsystem via the optical fiber.

24. The method of claim 23, wherein using the optical subsystem comprises at least one of:

using a diode laser to generate the optical signals; or
using a vertical cavity surface emitting laser (VCSEL) subsystem to generate the optical signals.

25. An electro-optical interface system comprising:

a housing;

an electrical circuit supported from the housing and configured to interface to a plurality of remote electrical components;

an electronics subsystem housed within the housing and in communication with the electrical circuit;

an optical subsystem housed within the housing and in communication with the electronics subsystem for receiving electrical signals from the electronics subsystem representative of electrical signals received from the remote electrical components, and converting the received electrical signals into optical signals for transmission to a remote subsystem;

wherein the electrical circuit includes a plurality of electrical contact pads for making electrical connections with the remote electrical components; and wherein the electrical contact pads are configured to project out from a side of the housing non-parallel to the longitudinal length of the housing.

* * * * *